(12) United States Patent
Zhu et al.

(10) Patent No.: US 10,651,087 B2
(45) Date of Patent: May 12, 2020

(54) METHOD FOR FORMING THREE-DIMENSIONAL INTEGRATED WIRING STRUCTURE AND SEMICONDUCTOR STRUCTURE THEREOF

(71) Applicant: Yangtze Memory Technologies Co., Ltd., Wuhan, Hubei (CN)

(72) Inventors: Jifeng Zhu, Hubei (CN); Jun Chen, Hubei (CN); Si Ping Hu, Hubei (CN); Zhenyu Lu, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,248

(22) Filed: Jul. 26, 2018

(65) Prior Publication Data

US 2019/0067105 A1 Feb. 28, 2019

Related U.S. Application Data

(63) Continuation of application No. PCT/CN2018/090457, filed on Jun. 8, 2018.

(30) Foreign Application Priority Data

Aug. 31, 2017 (CN) .......................... 2017 1 0774763

(51) Int. Cl.
*H01L 21/768* (2006.01)
*H01L 21/762* (2006.01)
(Continued)

(52) U.S. Cl.
CPC .. *H01L 21/76898* (2013.01); *H01L 21/76224* (2013.01); *H01L 23/481* (2013.01);
(Continued)

(58) Field of Classification Search
None
See application file for complete search history.

(56) References Cited

U.S. PATENT DOCUMENTS

| 8,791,575 B2 | 7/2014 | Oganesian et al. |
| 9,219,032 B2 | 12/2015 | Ramachandran et al. |

(Continued)

FOREIGN PATENT DOCUMENTS

| CN | 102347283 A | 2/2015 |
| CN | 104347364 A | 2/2015 |

(Continued)

OTHER PUBLICATIONS

International Search Report and Written Opinion of the International Searching Authority directed to related International Patent Application No. PCT/CN2018/090457, dated Sep. 18, 2018; 7 pages.

(Continued)

*Primary Examiner* — Charles D Garber
*Assistant Examiner* — Steven M Christopher
(74) *Attorney, Agent, or Firm* — Sterne, Kessler, Goldstein & Fox P.L.L.C.

(57) ABSTRACT

Embodiments of methods and structures for forming a 3D integrated wiring structure are disclosed. The method can include forming a dielectric layer in a first substrate; forming a semiconductor structure having a first conductive contact over a front side of the first substrate; and forming a second conductive contact at a backside of the first substrate, wherein the second conductive contact extends through a backside of the dielectric layer and connects to a second end of the first conductive contact. The 3D integrated wiring structure can include a first substrate; a dielectric layer in the first substrate; a semiconductor structure over the front side of the first substrate, having a first conductive contact; and (Continued)

a second conductive contact at the backside of the first substrate, and the second conductive contact extends through a backside of the dielectric layer and connects to the second end of the first conductive contact.

10 Claims, 7 Drawing Sheets

(51) Int. Cl.
*H01L 25/18* (2006.01)
*H01L 23/48* (2006.01)
*H01L 23/522* (2006.01)
*H01L 27/105* (2006.01)
*H01L 27/06* (2006.01)

(52) U.S. Cl.
CPC .......... *H01L 23/5226* (2013.01); *H01L 25/18* (2013.01); *H01L 27/0688* (2013.01); *H01L 27/1052* (2013.01)

(56) References Cited

U.S. PATENT DOCUMENTS

| | | |
|---|---|---|
| 2006/0003578 A1 | 1/2006 | Lee et al. |
| 2006/0223301 A1* | 10/2006 | Vanhaelemeersch ........................ H01L 21/762 438/618 |
| 2008/0272358 A1 | 11/2008 | Lin et al. |
| 2009/0008747 A1 | 1/2009 | Hoshino et al. |
| 2011/0089572 A1* | 4/2011 | Tezcan .............. H01L 21/76898 257/774 |
| 2011/0095373 A1 | 4/2011 | Hwang et al. |
| 2012/0258589 A1 | 10/2012 | Volant et al. |
| 2012/0306084 A1* | 12/2012 | Wood ................ H01L 21/76898 257/761 |
| 2014/0008757 A1 | 1/2014 | Vidhya et al. |
| 2014/0061750 A1* | 3/2014 | Kwon ................. H01L 27/1052 257/314 |
| 2015/0035168 A1 | 2/2015 | Tezcan et al. |
| 2015/0206936 A1 | 7/2015 | Huang |
| 2016/0141294 A1 | 5/2016 | Peri et al. |
| 2016/0163734 A1 | 6/2016 | Kim et al. |
| 2017/0110464 A1 | 4/2017 | Rabkin et al. |
| 2017/0207158 A1 | 7/2017 | Kang et al. |
| 2017/0236836 A1 | 8/2017 | Huo et al. |
| 2017/0323898 A1 | 11/2017 | Oh et al. |
| 2017/0365515 A1* | 12/2017 | Kuo .................. H01L 21/76898 |
| 2019/0013326 A1 | 1/2019 | Hua et al. |
| 2019/0067106 A1 | 2/2019 | Zhu et al. |

FOREIGN PATENT DOCUMENTS

| | | |
|---|---|---|
| CN | 104428887 A | 3/2015 |
| CN | 104810396 A | 7/2015 |
| CN | 105097817 A | 11/2015 |
| CN | 106876401 A | 6/2017 |
| CN | 106992162 A | 7/2017 |
| CN | 107644837 A | 1/2018 |
| CN | 107644838 A | 1/2018 |
| WO | WO-2019/041890 A1 | 3/2019 |
| WO | WO-2019/041956 A1 | 3/2019 |

OTHER PUBLICATIONS

International Search Report and Written Opinion of the International Searching Authority directed to related International Patent Application No. PCT/CN2018/087102, dated Aug. 21, 2018; 7 pages.

International Search Report directed to related International Patent Application No. PCT/CN2018/102496, dated Dec. 3, 2018; 2 pages.

International Search Report directed to related International Patent Application No. PCT/CN2018/102504, dated Dec. 11, 2018; 2 pages.

Chinese Office Action directed to related Chinese Patent Application No. PCT/CN2018/087102 with attached English-language translation, dated Oct. 14, 2019; 22 pages.

* cited by examiner

METHOD FOR FORMING THREE-DIMENSIONAL INTEGRATED WIRING STRUCTURE AND SEMICONDUCTOR STRUCTURE THEREOF

CROSS-REFERENCE TO RELATED APPLICATIONS

This application claims priority to Chinese Patent Application No. 201710774763.5 filed on Aug. 31, 2017 and PCT Application No. PCT/CN2018/090457 filed on Jun. 8, 2018, the entire content of which is incorporated herein by reference.

BACKGROUND

Embodiments of the present disclosure relate to the field of semiconductor manufacturing technology, and in particular to method for forming a 3D integrated wiring structure (e.g., a memory structure.)

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of methods for forming a 3D integrated wiring structure and semiconductor structures thereof are disclosed herein.

Disclosed is a method for forming a 3D integrated wiring structure, including: forming a dielectric layer in a first substrate; forming a semiconductor structure having a first conductive contact over a front side of the first substrate; and forming a second conductive contact at a backside of the first substrate, wherein the second conductive contact extends through a backside of the dielectric layer and connects to a second end of the first conductive contact. In some embodiments, the semiconductor structure includes a first conductive layer above the dielectric layer and the first conductive contact. In some embodiments, a first end of the first conductive contact connects to the first conductive layer and a second end of the first conductive contact extends through a front side of the dielectric layer.

In some embodiments, a backside of the dielectric layer is between the front side and the backside of the first substrate, and a front side of the dielectric layer is at a same height as the front side of the first substrate with respect to the backside of the first substrate.

In some embodiments, a backside of the dielectric layer is between the front side and the backside of the first substrate, and a front side of the dielectric layer is higher than the front side of the first substrate with respect to the backside of the first substrate.

In some embodiments, a backside of the dielectric layer is at a same height as the front side of the first substrate, and a front side of the dielectric layer is higher than the front side of the first substrate with respect to the backside of the first substrate.

In some embodiments, the second end of the first conductive contact is formed at the same height as the front side of the dielectric layer.

In some embodiments, the second end of the first conductive contact is formed between the front side and backside of the dielectric layer.

In some embodiments, the second end of the first conductive contact is formed at the same height as the backside of the dielectric layer.

In some embodiments, the method further includes disposing an insulating layer between a sidewall of the second conductive contact and the first substrate.

In some embodiments, the method further includes performing a thinning process to reduce a thickness of the first substrate from the backside of the first substrate prior to forming the second conductive contact.

In some embodiments, the method further includes forming a first passivation layer on the backside of the first substrate after performing the thinning process.

In some embodiments, the method further includes joining a second substrate with the semiconductor structure such that the semiconductor structure is sandwiched between the first substrate and the second substrate.

In some embodiments, joining the second substrate with the semiconductor structure includes a bonding process including adhesive bonding, anodic bonding, direct wafer bonding, eutectic bonding, hybrid bonding, or a combination thereof.

In some embodiments, the method further includes forming a conductive wiring layer at the backside of the first substrate, and the conductive wiring layer is electrically connected to the second conductive contact.

In some embodiments, forming the semiconductor structure includes forming a plurality of 3D memory structures.

Another aspect of the present disclosure provides a structure, including: a first substrate, having a front side and a backside; a dielectric layer in the first substrate; a semiconductor structure over the front side of the first substrate, having a first conductive contact; and a second conductive contact at the backside of the first substrate, and the second conductive contact extends through a backside of the dielectric layer and connects to the second end of the first conductive contact. In some embodiments, the semiconductor structure includes a first conductive layer above the dielectric layer and the first conductive contact. In some embodiments, a first end of the first conductive contact connects to the first conductive layer and a second end of the first conductive contact extends through a front side of the dielectric layer.

In some embodiments, the first conductive contact and the second conductive contact includes copper, aluminum, tin, tungsten, or a combination thereof.

In some embodiments, the structure further includes an insulating layer between a sidewall of the second conductive contact and the first substrate.

In some embodiments, the first substrate includes a first passivation layer on the backside of the first substrate.

In some embodiments, the structure further includes a second substrate joined to a front side of the semiconductor structure such that the semiconductor structure is sandwiched between the first substrate and the second substrate.

In some embodiments, the structure further includes a conductive wiring layer at the backside of the first substrate, wherein the conductive wiring layer is electrically connected to the second conductive contact.

In some embodiments, the semiconductor structure includes a plurality of 3D memory structures.

In some embodiments, thickness of the plurality of 3D memory structures is between about 1 μm and 50 μm.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
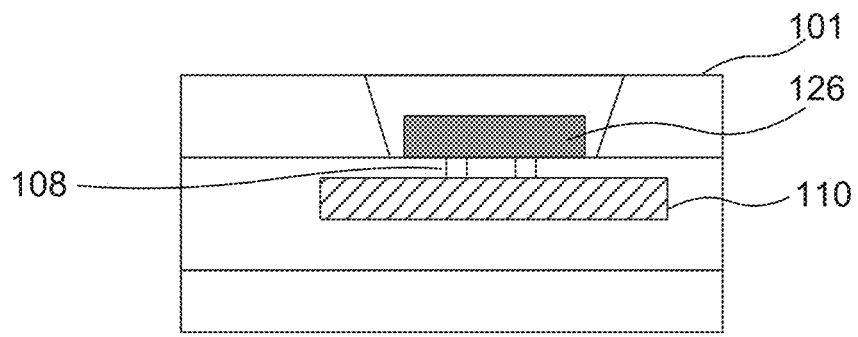
FIG. 1 illustrates a wiring method.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. A substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "contact" can broadly include any suitable types of interconnects, such as middle-end-of-line (MEOL) interconnects and back-end-of-line (BEOL) interconnects, including vertical interconnect plug accesses (e.g., vias) and lateral lines (e.g., interconnect lines).

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "vertical/vertically" means nominally perpendicular to a lateral surface of a substrate.

As used herein, the term "3D memory device" refers to a semiconductor device with vertically-oriented strings of memory cell transistors (referred to herein as "memory strings," such as NAND strings) on a laterally-oriented substrate so that the memory strings extend in the vertical direction with respect to the substrate.

Figure 2:
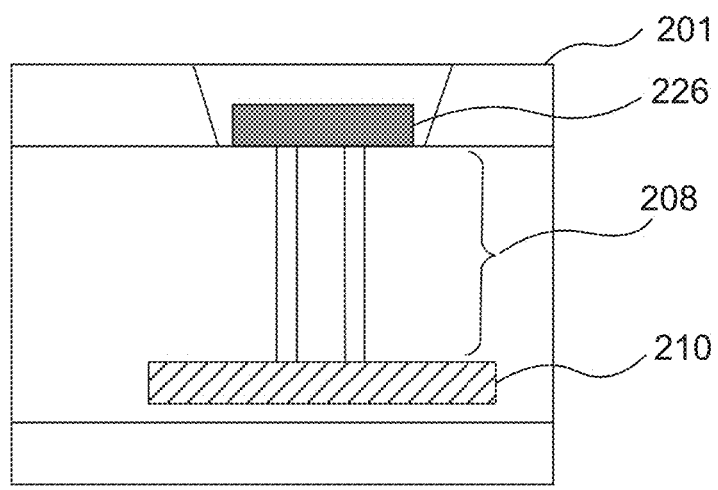
FIG. 2 illustrates a wiring method for forming a 3D semiconductor structure.

As shown in FIG. 1, current wafer wiring technology includes etching directly a backside of wafer 101, exposing first conductive layer ($M_1$) 110 and forming an electrical connection between metal wiring layer 126 and metal layer 110 through vias 108. As shown in FIG. 2, in current 3D memory technology, a memory cell is fabricated perpendicularly to a wafer surface, forming a thick semiconductor device layer 208 with a thickness up to about 5 microns (μm), between metal wiring layer 226 and first conductive layer 210, which makes forming an electrical connection between metal wiring layer 226 and first conductive layer 210 challenging using traditional wiring techniques.

Various embodiments in accordance with the present disclosure provide a method for forming a 3D integrated wiring structure and a semiconductor device with an interconnect structure. The method for forming a 3D integrated wiring structure disclosed herein can include forming a dielectric layer in a first substrate; forming a semiconductor structure having a first conductive contact over a front side of the first substrate; and forming a second conductive contact at a backside of the first substrate, wherein the second conductive contact extends through a backside of the dielectric layer and connects to a second end of the first conductive contact. As a result, the method for forming a 3D integrated wiring structure disclosed herein can provide an interconnect structure and enable wiring through a thick semiconductor device layer to streamline fabrication process, reduce production cost and improve device quality.

Figure 3:
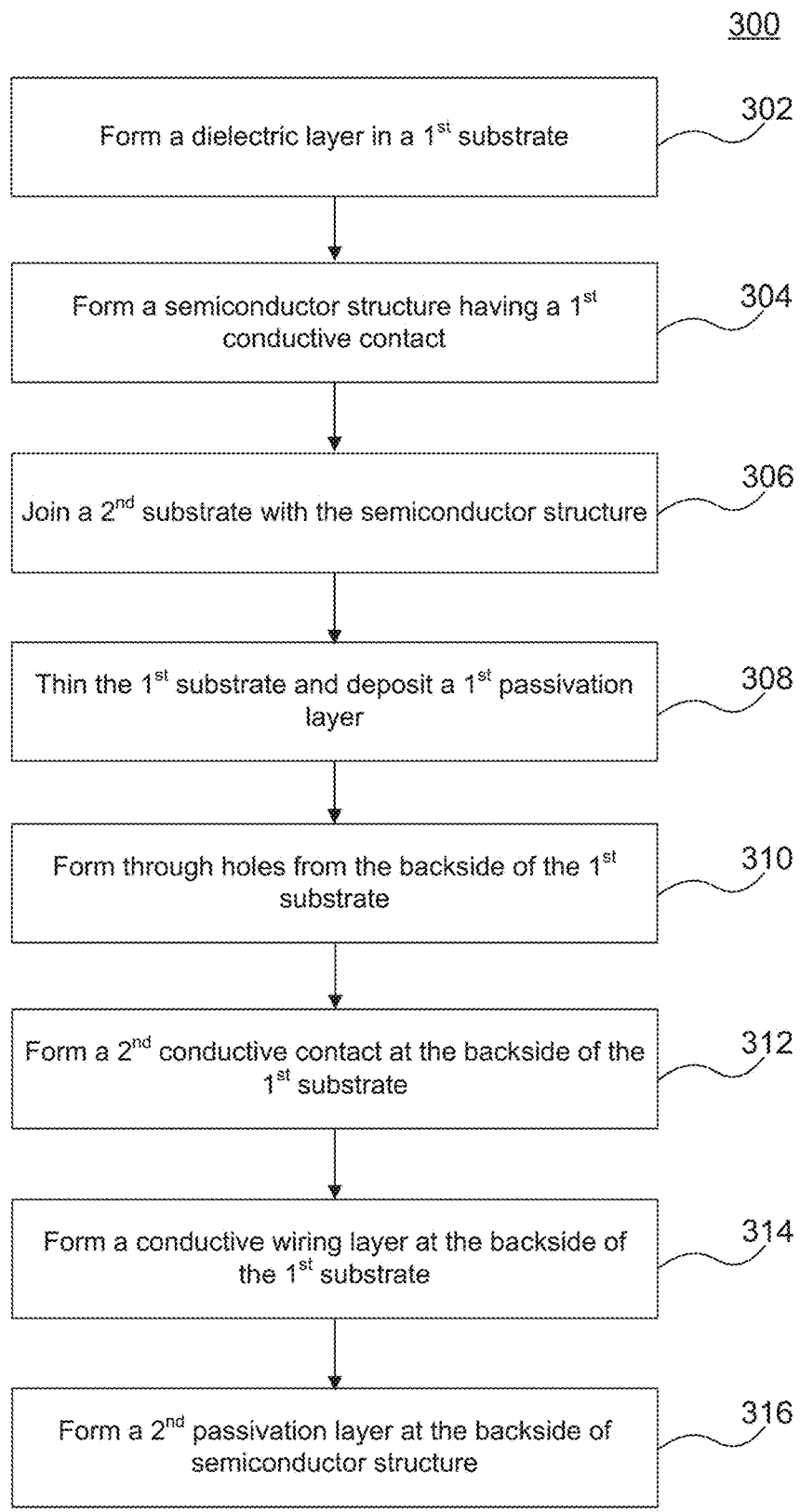
FIG. 3 is a flowchart of an exemplary wiring method for forming a 3D integrated wiring structure, according to some embodiments of the present disclosure.

FIG. 3 is a flowchart of an exemplary integrated wiring method 300 for forming a 3D memory device, according to some embodiments of the present disclosure. FIGS. 4A-10 illustrate an exemplary fabrication method to form a 3D memory device, according to some embodiments of the present disclosure. It should be understood that the operations shown in method 300 and the fabrication method shown in FIGS. 4-10 are not exhaustive and that other methods and operations can be performed as well before, after, or between any of the illustrated methods and operations.

Referring to FIG. 3 and FIGS. 4A-4C, method 300 starts at operation 302, in which dielectric layer 404 is formed in first substrate 402 on front side 403. As used herein, the term "front side" of a structure refers to the side of the structure at which a device is formed. Conversely, as used herein, the term "backside" refers to the side of the structure that is opposite to the front side. For ease of illustration, first substrate 402 is shown upside down such that backside 401 of first substrate 402 is above front side 403.

Figure 4A:
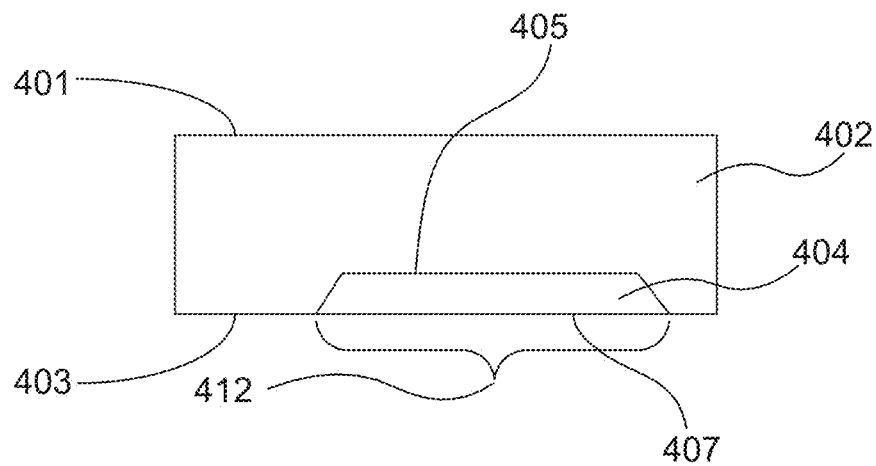
FIGS. 4A-4C and 5-10 illustrate an exemplary fabrication process for forming a 3D integrated wiring structure, according to some embodiments of the present disclosure.
Figure 4B:
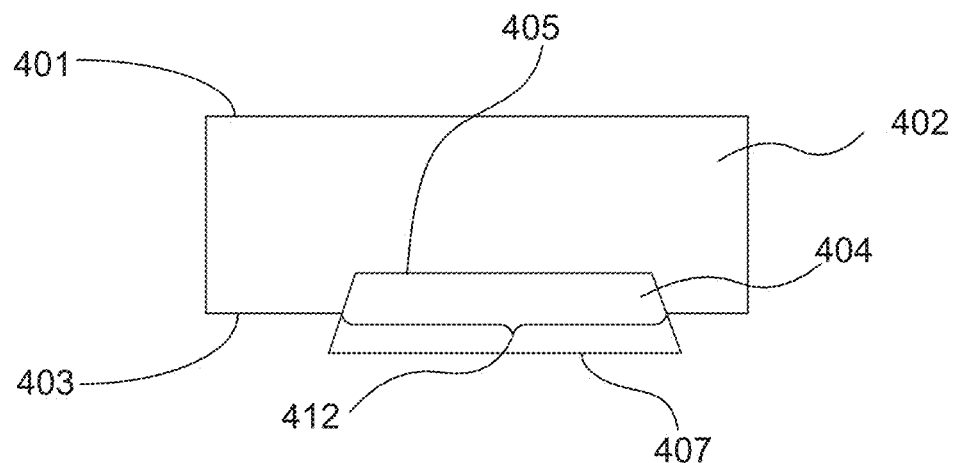
Figure 4C:
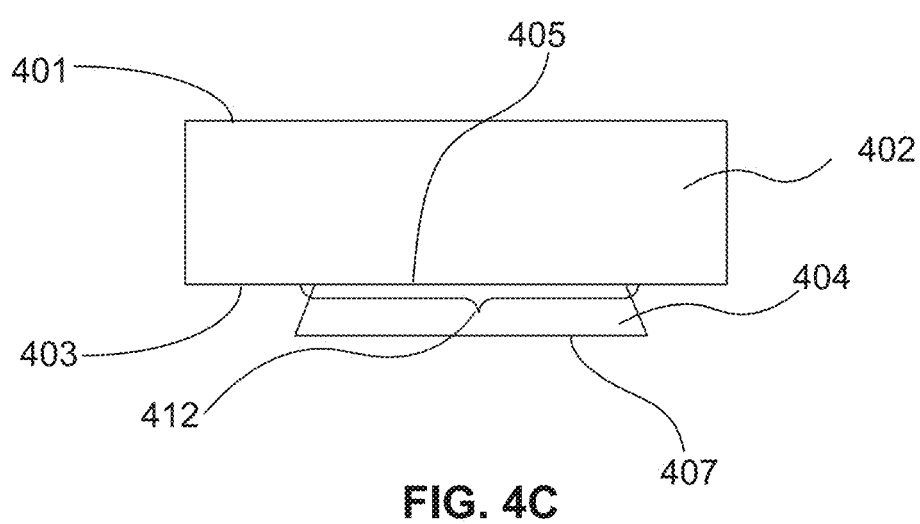

The materials of first substrate 402 can be silicon, germanium, a III-V semiconductor, silicon carbide, or silicon on insulating substrate, or a combination thereof. In some embodiments, the first substrate 402 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, first substrate 402 is a silicon wafer. First substrate 402 can include one or more contact regions 412 wherein a plurality of contacts can be formed. Dielectric layer 404 is formed in the contact region 412. In some embodiments, the material for dielectric layer 404 can include oxides, nitrides or a combination thereof. Operation 302 to form dielectric layer 404 includes, but not limited to, lithography, etching, deposition, filling, polishing, or a combination thereof. In some embodiments, the fabrication method to form dielectric layer 404 includes forming a shallow trench in contact region 412 of front side 403 of first substrate 402 through a lithography and etching process, depositing and filling the shallow trench with a dielectric material, and optionally planarizing the dielectric layer thought polishing. In some embodiments, backside 405 of dielectric layer 404 is located between front side 403 and backside 401 of first substrate 402, and front side 407 of dielectric layer 404 is at the same height as front side 403 of first substrate 402, as shown in FIG. 4A. In some embodiments, backside 405 of dielectric layer 404 is located between front side 403 and backside 401 of first substrate 402, and front side 407 of dielectric layer 404 is higher than front side 403 of first substrate 402, as shown in FIG. 4B. In some embodiments, the fabrication method to form dielectric layer 404 includes depositing a dielectric layer at front side 403 of first substrate 402, and optionally planarizing the dielectric layer thought polishing. In some embodiments, backside 405 of dielectric layer 404 is at the same height as front side 403 of first substrate 402, and front side 407 of dielectric layer 404 is higher than front side 403 of first substrate 402, as shown in FIG. 4C. In some embodiments, the thickness of dielectric layer 404 is between about 200 Å and 2 μm. In some embodiments, the thickness of dielectric layer 404 is between about 200 Å and 200 Å. In some embodiments, the thickness of dielectric layer 404 is between about 800 Å and 1 μm.

An exemplary fabricated method to form dielectric layer 404 as shown in FIGS. 4A and 4B is disclosed as follows. First, a patterned hard mask layer is formed on front side 403 of first substrate 402 (e.g., silicon wafer), followed by a sequential etching of first substrate 402 to form a shallow trench. The hard mask layer can include a silicon nitride layer formed by a chemical vapor deposition process, a silicon oxide layer formed by a High Density Plasma Chemical Vapor Deposition (HDPCVD) process or a combination thereof. The hard mask layer and first substrate 402 can be etched to form trenches using any well-known techniques recognized by those skilled in the art. Second, a dielectric layer is filled in the shallow trench and on the hard mask layer using HDPCVD or any well-known techniques recognized by those skilled in the art. The material of dielectric layer 404 can include, but not limited to, oxides, nitrides, oxynitrides, a combination thereof, or the like. In some embodiments, the dielectric layer 404 material can include silicon oxide, silicon nitride, silicon oxynitride, or a combination thereof. Third, the dielectric layer on the hard mask layer is completely removed by a chemical mechanical polishing (CMP) method or any well-known techniques recognized by those skilled in the art to fully expose the surface of the hard mask layer. Fourth, a rapid thermal oxidation method is performed at an ambient temperature of 400 to 800° C. In some embodiments, the ambient temperature is 500-700° C. In some embodiments, the ambient temperature is linearly heated to 400-800° C. within 60-140 seconds during rapid thermal oxidation process. In some embodiments, the ambient temperature can be, for example, 450° C., 480° C., 550° C., 600° C., 660° C., 640° C., and 750° C. The linear heating time can be 70 seconds, 75 seconds, 80 seconds, 95 seconds, 103 seconds, 115 seconds, 125 seconds, 130 seconds. In some embodiments, the rapid thermal oxidation method can include an operation to introduce an oxygen-containing gas into the environment where the trench is located. The oxygen-containing gas can include oxygen ($O_2$), ozone ($O_3$), or any other gas that has oxidizing ability. While not being bound by any particular theory or mechanism, it is believed that this operation can eliminate damage to the atomic structure at the corners of the trench caused by the prior fabrication processes and prevent further damage to the atomic structure at the corners of the trench in subsequent processes. In the rapid thermal oxidation process, the dielectric layer in the trench is in a high-temperature oxygen environment, the concentration and molecular activity of oxygen molecules in the high-temperature environment is high. The original molecular structure is relatively loose at the corner of the trench, so the free silicon ions generated during the CMP process can be fully oxidized in this process. And the newly oxidized oxides and the original oxide molecules in the dielectric layer in the trenches can form a stable molecular bond at the high temperature. The loose oxides structure at the corners of the dielectric layer in the trenches becomes firm and dense, therefore, repairing damage to the atomic structure at the corner of the trench caused by the prior fabrication processes. This high temperature oxidation process can be referred to as high temperature quenching. Lastly, the hard mask layer is removed by wet etching or any well-known techniques recognized by those skilled in the art. The choices of chemical etching agent vary depending on the materials of the hard mask layer, and are techniques known to those skilled in the art.

Figure 5:
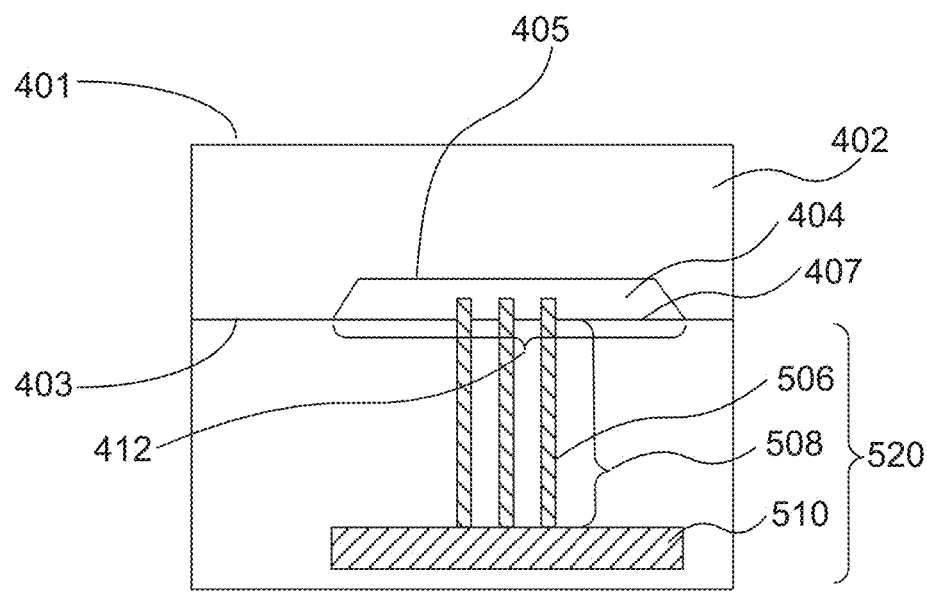

Referring to FIG. 3 and FIG. 5, method 300 proceeds to operation 304, in which semiconductor structure 520 is formed over front side 403 of first substrate 402. In some embodiments, the semiconductor structure 520, located at front side 403 of first substrate 402, can include first conductive layer 510 above the dielectric layer and first conductive contact 506. A first end of first conductive contact 510 connects to first conductive layer 510 and a second end of first conductive contact 510 extends through a front side of the dielectric layer. In some embodiments, semiconductor structure 520 is a memory array structure including, semiconductor device layer 508, first conductive contact 506 (e.g., through array contacts (TACs) or contact vias) formed in semiconductor device layer 508 and aligned with contact region 412, dielectric layer 404 formed over contact region 412 and between front side 403 of first substrate 402 and semiconductor device layer 508, and first conductive layer 510 at a front side of the semiconductor device layer 508. Forming semiconductor structure 520 includes, but not limited to, lithography, etching, deposition, filling, polishing, or a combination thereof. As used herein, the term "front side" of a structure refers to the side of the structure at which a device is formed. Conversely, as used herein, the term "backside" refers to the side of the structure that is opposite to the front side. For ease of illustration, semiconductor structure 520 is shown upside down in FIGS. 5-10 such that the backside of the semiconductor structure 520 is above the front side. However, it is understood that in practice, semiconductor structure 520 can be flipped such that backside 401 of first substrate 402 becomes a bottom surface of semiconductor structure 520 during the fabrication process.

In some embodiments, semiconductor device layer 508 can include a memory stack. In some embodiments, the memory stack is formed by repeatedly stacking a plurality of memory cells. In some embodiments, the thickness of semiconductor device layer 508 is between about 1 µm and 50 µm. In some embodiments, the thickness of semiconductor device layer 508 is between about 5 µm and 50 µm. In some embodiments, the thickness of semiconductor device layer 508 is greater than 5 µm. In some embodiments, memory array stack is formed by multiple fabrication methods, including, but not limited to, thin film deposition of dielectric layers, etching of channel holes and slits, thin film deposition of memory films in the channel holes, and gate and word line replacement. In some embodiments, memory array stack can be formed (e.g., disposed) at front side 403 of first substrate 402 and can include an alternating conductor/dielectric stack and an array of NAND strings extending through the alternating conductor/dielectric stack. The alternating conductor/dielectric stack can include alternating conductor layers (e.g., metal layers or polysilicon layers) and dielectric layers (e.g., silicon oxide layers or silicon nitride layers). Each NAND string can include a plurality of vertically-stacked memory cells each controlled by a respective conductor layer (functioning as a control gate) of the alternating conductor/dielectric stack that surrounds the NAND string. The conductor layers in the alternating conductor/dielectric stack can extend in the lateral direction outside the memory array region to thereby form word lines of semiconductor structure 520 (e.g., memory array structure). Each NAND string can also include a drain at an end (e.g., at a front side of semiconductor structure 520). The drain of each NAND string can be electrically connected to a respective one of a plurality of bit lines of semiconductor structure 520. In some embodiments, each NAND string further includes multiple select gates (e.g., a source select gate and a drain select gate). Some structures described in this paragraph are not shown in FIG. 5 as they would be appreciated by a person skilled in the pertinent art.

Semiconductor structure 520 can include one or more first conductive contact 506 (TACs or contact vias) each extending vertically through at least part of semiconductor structure 520. In some embodiments, first conductive contact 506 can extend vertically through entire semiconductor structure 520, i.e., between the two nominally parallel surfaces at a front side and a backside of semiconductor structure 520. For example, first conductive contacts 506 can pass through entire semiconductor device layer 508 and entire first substrate 402. In some embodiments, first conductive contacts 506 can extend vertically through part of semiconductor structure 520. In some embodiments, first conductive contacts 506 can pass through entire semiconductor device layer 508 and part of dielectric layer 404. In some embodiments, the first conductive contacts 506 can pass through entire semiconductor device layer 508 and entire dielectric layer 404 so that first conductive contacts 506 reach backside 405 of dielectric layer 404. In some embodiments, first conductive contacts 506 can pass through entire semiconductor device layer 508 and part of first substrate 402. In some embodiments, first conductive contacts 506 can pass through part of semiconductor device layer 508 without reaching to first substrate 402. In some embodiments, first conductive contacts 506 are in contact with dielectric layer 404 at one end, and in contact with first conductive layer 510 at another end.

Each contact 506 can include a vertical opening filled with conductor materials, including, but not limited to, tungsten (W), cobalt (Co), copper (Cu), aluminum (Al), doped silicon, silicide, or a combination thereof.

In some embodiments, the diameter of the contacts is between about 0.3 µm and 5 µm. In some embodiments, the diameter of the contacts is between about 0.3 µm and 0.5 µm. In some embodiments, the diameter of the contacts is between about 1 µm and 5 µm.

First conductive contacts 506 can be in a memory array region and/or outside the memory array region, for example, in a staircase region of semiconductor structure 520. First conductive contacts 506 can form electrical connection with word line contacts, bit line contacts, and gate select contacts. The word line contacts can be in the staircase region and electrically connect to the word lines, such that each word line contact can individually address the corresponding word line. The bit line contacts can electrically connect to the NAND strings by the bit lines, such that each bit line contact can individually address the corresponding NAND string. The gate select contacts can electrically connect to the select gates. Some structures described in this paragraph are not shown in FIG. 5, as they would be appreciated by a person skilled in the pertinent art.

Semiconductor structure 520 can include first conductive layer 510 at a front side of semiconductor device layer 508. First conductive layer 510 can provide connection to the memory array structure and/or the peripheral device structure. First conductive layer 510 can be patterned based on the layout of the internal structure of memory array device and/or the peripheral device structure, so that suitable interconnect structures can be formed. First conductive layer 510 can include, but not limited to, W, Co, Cu, Al, metal silicide, or any other suitable materials.

Figure 6:
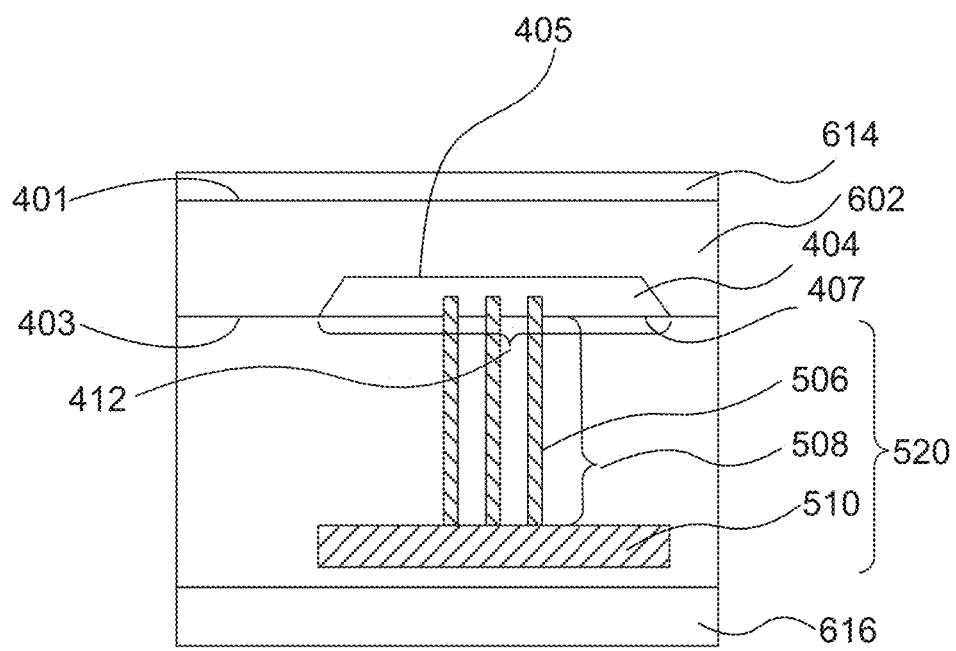

Referring to FIG. 3 and FIG. 6, method 300 proceeds to operations 306 and 308, in which second substrate 616 is joined to semiconductor structure 520, followed by a thinning process of the backside of first substrate 402 to form substrate 602 and deposition of first passivation layer 614. As illustrated in FIG. 6, substrate 616 can be joined to the front side of semiconductor structure 520 through a bonding process. In some embodiments, the bonding process can include adhesive bonding, anodic bonding, direct wafer bonding, eutectic bonding, hybrid metal/dielectric bonding or a combination thereof. Adhesive bonding, also referred to as gluing or glue bonding, is a wafer bonding technique with applying an intermediate layer to connect substrates of different materials. Anodic bonding is a wafer bonding process to seal glass to either silicon or metal without introducing an intermediate layer, which is commonly used to seal glass to silicon wafers in electronics and microfluidics, through electric fields. Direct bonding, also referred to as fusion bonding, is a wafer bonding process without any additional intermediate layers. The direct bonding process is based on chemical bonds between two surfaces of material meeting specific requirements. The direct bonding process can include wafer preprocessing, pre-bonding at room temperature and annealing at elevated temperatures. Eutectic bonding, also referred to as eutectic soldering, is a wafer bonding technique with an intermediate metal layer that can produce a eutectic system. Hybrid bonding, also known as "metal/dielectric hybrid bonding", can be a direct bonding technology (e.g., forming bonding between surfaces without using intermediate layers, such as solder or adhesives), which obtains metal-metal bonding and dielectric-dielectric bonding simultaneously.

The materials of substrate 616 can be silicon, germanium, a III-V semiconductor, silicon carbide, or silicon on insulating substrate, or a combination thereof. In some embodiments, the second substrate 616 can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, the second substrate 616 is silicon wafer.

In some embodiments, the thickness of first passivation layer 614 is between about 100 Å and 10 μm. In some embodiments, the thickness of first passivation layer 614 is between about 100 Å and 5000 Å. In some embodiments, the thickness of first passivation layer 614 is between about 1 μm and 10 μm.

Then the first substrate 602 is thinned from backside through techniques including, but not limited to, mechanical grinding (e.g., polishing), chemical mechanical planarization, wet etching and atmospheric downstream plasma dry chemical etching. In some embodiments, the thickness of substrate 602 is between about 0.5 μm and 20 μm. In some embodiments, the thickness of substrate 602 is between about 0.5 μm and 5 μm. In some embodiments, the thickness of substrate 602 is between about 5 μm and 20 μm.

In some embodiments, first passivation layer first 614 is deposited at the backside of first substrate 402 (substrate 602) after performing the thinning process. The material of first passivation layer 614 can include oxides, nitrides, oxynitrides, or a combination thereof. In some embodiments, first passivation layer 614 includes silicon oxide, silicon nitride, silicon oxynitride, or a combination thereof. First passivation layer 614 can be formed by one or more thin film deposition processes, such as Atomic Layer Deposition (ALD), Chemical Vapor Deposition (CVD), Physical Vapor Deposition (PVD), or a combination thereof.

Figure 7:
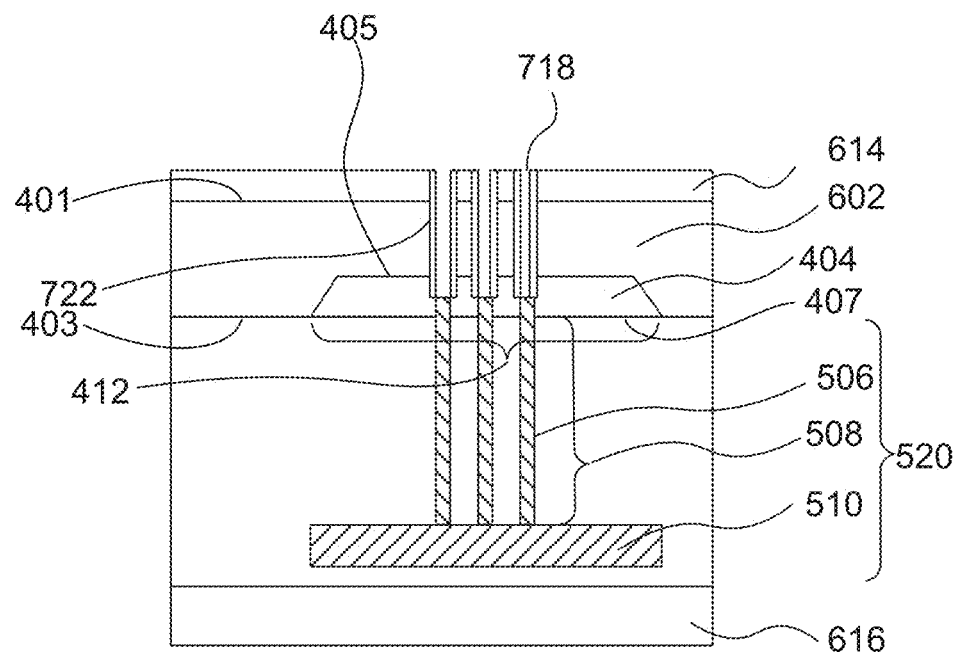

Referring to FIG. 3 and FIG. 7, method 300 proceeds to operation 310, in which a plurality of through holes 718 are formed in first passivation layer 614 and substrate 602. As illustrated in FIG. 7, through holes 718 extend through backside 401 of substrate 602 and portion of dielectric layer 404. In some embodiments, through holes 718 can be aligned with first conductive contacts 506 and first conductive contacts 506 are exposed from through holes 718. In some embodiments, fabrication methods to form through holes 718 include forming a plurality of holes that extends vertically through first passivation layer 614 and substrate 602 using techniques including, but not limited to, lithography, etching, depositing an insulating layer or a combination thereof. Then insulating layer 722 is deposited between a sidewall of the second conductive contact and the first substrate to form an insulting liner. The material of insulating layer 722 can include oxides, nitrides, oxynitrides, or a combination thereof. In some embodiments, insulating layer 722 includes silicon oxide, silicon nitride, silicon oxynitride, or a combination thereof. Insulating layer 722 can be formed by one or more thin film deposition methods, such as ALD, CVD, PVD, or a combination thereof.

Figure 8:
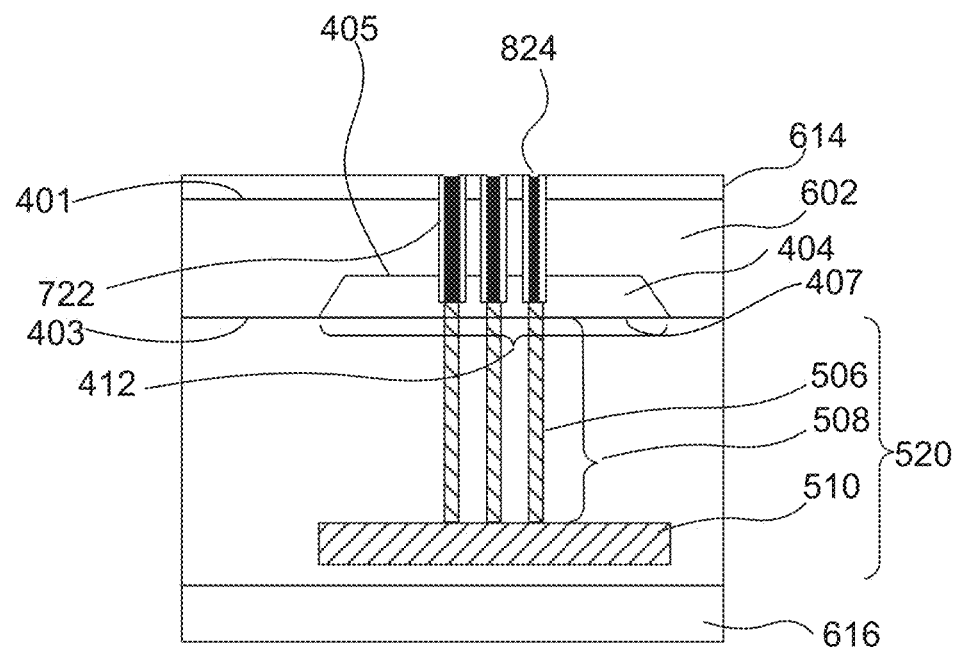

Referring to FIG. 3 and FIG. 8, method 300 proceeds to operation 312, in which a second conductive contact 824 is formed at the backside of first substrate 602 by disposing conductive materials into plurality of through holes 718. As illustrated in FIG. 8, the through holes 718 are filled with conductive materials using ALD, CVD, PVD, any other suitable methods, or a combination thereof. The conductor materials used for filling the through holes 718 can include, but are not limited to, W, Co, Cu, Al, Sn, polysilicon, silicides, or a combination thereof. In some embodiments, other conductor materials are also used to fill the openings to function as a barrier layer, an adhesion layer, and/or a seed layer. In some embodiments, conductive materials filled in through holes 718 are electrically connected with first conductive contacts 506. In some embodiments, the diameter of through holes 718 is between about 0.3 μm and 5 μm. In some embodiments, the diameter of through holes 718 is between about 0.3 μm and 1 μm. In some embodiments, the diameter of through holes 718 is between about 1 μm and 5 μm.

Figure 9:
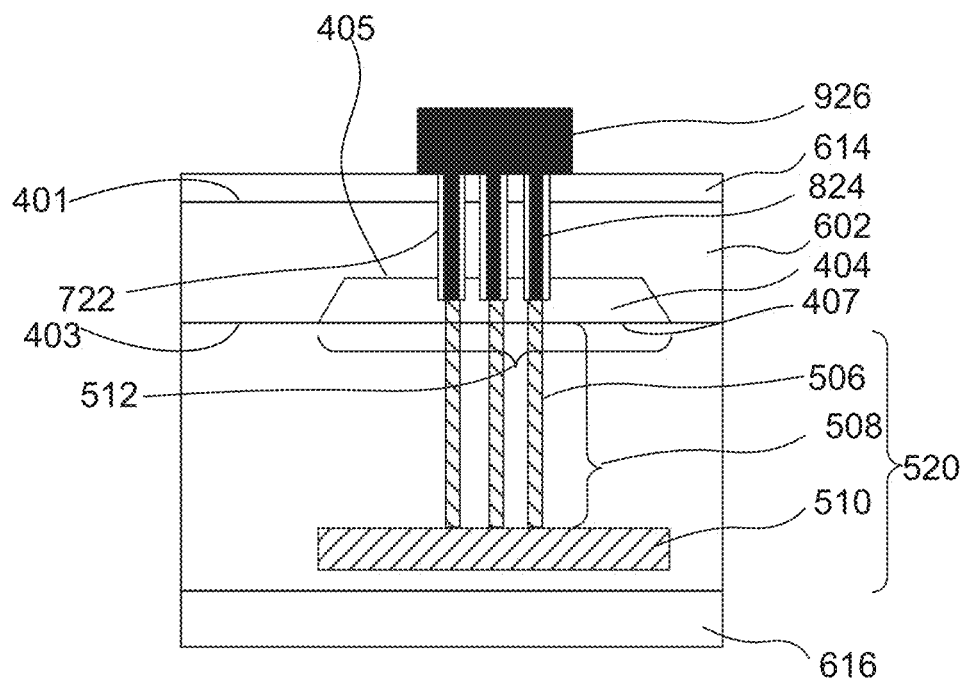

Referring to FIG. 3 and FIG. 9, method 300 proceeds to operation 314, in which conductive wiring layer 926 is formed at the backside of the first substrate. As illustrated in FIG. 9, a conductive layer is deposited at the backside of first substrate 602 and patterned through photolithography and etching to form conductive wiring layer 926. Conductive wiring layer 926 can form an electrical connection with second conductive contact 824. In some embodiments, conductive wiring layer 926 can form an electrical connection with first conductive contacts 506, the first conductive layer 510, and/or the second substrate 616. Conductive wiring layer 926 can be patterned based on the layout of the internal structure of memory array device and/or the peripheral device structure, so that suitable interconnect structures can be formed. Conductive wiring layer 926 can include, but not limited to, W, Co, Cu, Al, Ag, Sn, metal silicide, or any other suitable materials. In some embodiments, conductive wiring layer 926 are in or on one or more BEOL interconnect layers (not shown) at the backside of semiconductor structure 520.

In some embodiments, to reduce stress of semiconductor structure 520 caused by the conductive wiring layer 926, the distance in the vertical direction between conductive wiring layer 926 and semiconductor device layer 508 is at least about 3 μm. For example, the combined thickness of first substrate 402 of semiconductor structure 520 and the BEOL interconnect layers underneath conductive wiring layer 926 can be at least about 3 μm. In some embodiments, the vertical distance between conductive wiring layer 926 and semiconductor device layer 508 is between about 3 μm and 10 μm (e.g., about 3 μm, about 4 μm, about 5 μm, about 6 μm, about 7 μm, about 8 μm, about 9 μm, about 10 μm, in any range bounded on the lower end defined by any of these values, or in any range defined by any two of these values). In some embodiments, conductive wiring layer 926 can completely overlap semiconductor structure 520. In some embodiments, conductive wiring layer 926 can partially overlap semiconductor structure 520.

Figure 10:
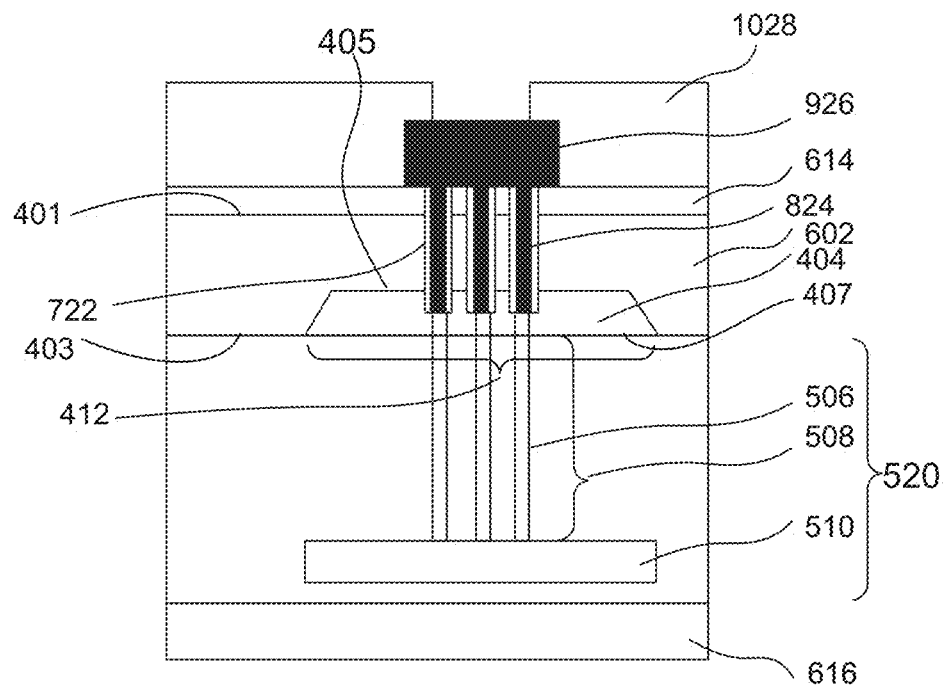

Referring to FIG. 3 and FIG. 10, method 300 proceeds to operation 316, in which second passivation layer 1028 is formed at the backside of semiconductor structure 520. As illustrated in FIG. 10, second passivation layer 1028 is deposited at the backside of semiconductor structure 520 over conductive wiring layer 926 and first passivation layer 614. The material of second passivation layer 1028 can include oxides, nitrides, oxynitrides, or a combination thereof. In some embodiments, second passivation layer 1028 includes silicon oxide, silicon nitride, silicon oxynitride, or a combination thereof. Second passivation layer 1028 can be formed by one or more thin film deposition methods, such as ALD, CVD, PVD, or a combination thereof. Second passivation layer 1028 can be patterned based on the layout of the internal structure of memory array device and/or the peripheral device structure, so that suitable interconnect structures can be formed.

In some embodiments, the 3D memory device can further include a peripheral device structure (not shown) on substrate 616, which are positioned face to face with their front sides facing towards the memory array structure. The peripheral device can include any suitable digital, analog, and/or mixed-signal peripheral circuits used for facilitating the operation of 3D memory device. For example, the peripheral device can include one or more of a page buffer, a decoder (e.g., a row decoder and a column decoder), a driver, a charge pump, a current or voltage reference, or any active or passive components of the circuits (e.g., transistors, diodes, resistors, or capacitors). In some embodiments, the peripheral device is formed using CMOS technology.

In some embodiments, a 3D integrated wiring structure of a semiconductor device is provided, wherein the 3D integrated wiring structure is made by the methods described in any one of the above embodiments. In some embodiments, the semiconductor device is a 3D memory device. In some embodiments, the 3D integrated wiring structure comprises a memory device layer having a plurality of contacts, and a first conductive layer. In some embodiments, the plurality of contacts connects to the dielectric layer at one end and connects to the first conductive layer at the other end.

Various embodiments in accordance with the present disclosure provide a method for forming a 3D integrated wiring structure and a semiconductor device with an interconnect structure. The method for forming a 3D integrated wiring structure disclosed herein can include forming a dielectric layer in a first substrate; forming a semiconductor structure having a first conductive contact over a front side of the first substrate; and forming a second conductive contact at a backside of the first substrate, wherein the second conductive contact extends through a backside of the dielectric layer and connects to a second end of the first conductive contact. As a result, the method for forming a 3D integrated wiring structure disclosed herein can provide an interconnect structure and enable wiring through a thick semiconductor device layer.

In some embodiments, a method for forming a 3D integrated wiring structure is disclosed. A dielectric layer is formed in a first substrate. A semiconductor structure is formed over a front side of the first substrate. The semiconductor structure includes a first conductive layer above the dielectric layer and a first conductive contact. A first end of the first conductive contact connects to the first conductive layer and a second end of the first conductive contact extends through a front side of the dielectric layer. A second conductive contact is formed at a backside of the first substrate. The second conductive contact extends through a backside of the dielectric layer and connects to the second end of the first conductive contact.

In some embodiments, a structure with a 3D integrated wiring structure is disclosed. The 3D integrated wiring structure can include: a first substrate, having a front side and a backside; a dielectric layer in the first substrate; a semiconductor structure over the front side of the first substrate, having a first conductive contact; and a second conductive contact at the backside of the first substrate, and the second conductive contact extends through a backside of the dielectric layer and connects to the second end of the first conductive contact. In some embodiments, the semiconductor structure includes a first conductive layer above the dielectric layer and the first conductive contact. In some embodiments, a first end of the first conductive contact connects to the first conductive layer and a second end of the first conductive contact extends through a front side of the dielectric layer. In some embodiments, the semiconductor structure is a 3D memory structure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A structure, comprising:
a first substrate, having a front side and a backside;
a dielectric layer in the first substrate;
a semiconductor structure over the front side of the first substrate, wherein the semiconductor structure comprises a first conductive layer above the dielectric layer and a first conductive contact, wherein a first end of the first conductive contact connects to the first conductive layer and a second end of the first conductive contact extends through a front side of the dielectric layer; and
a second conductive contact at the backside of the first substrate, wherein the second conductive contact extends through a backside of the dielectric layer and connects to the second end of the first conductive contact.

2. The structure of claim 1, wherein a backside of the dielectric layer is between the front side and the backside of the first substrate, and a front side of the dielectric layer is at a same height as the front side of the first substrate with respect to the backside of the first substrate; or a backside of the dielectric layer is between the front side and the backside of the first substrate, and a front side of the dielectric layer is higher than the front side of the first substrate with respect to the backside of the first substrate; or a backside of the dielectric layer is at a same height as the front side of the first substrate, and a front side of the dielectric layer is higher than the front side of the first substrate with respect to the backside of the first substrate.

3. The structure of claim 1, wherein the second end of the first conductive contact is formed at the same height as the front side of the dielectric layer or is formed between the front side and backside of the dielectric layer or is formed at the same height as the backside of the dielectric layer.

4. The structure of claim 1, wherein the first conductive contact and the second conductive contact comprises copper, aluminum, tin, tungsten, or a combination thereof.

5. The structure claim 1, further comprising an insulating layer between a sidewall of the second conductive contact and the first substrate.

6. The structure of claim 1, wherein the first substrate comprises a first passivation layer on the backside of the first substrate.

7. The structure of claim 1, further comprising a second substrate joined to a front side of the semiconductor structure such that the semiconductor structure is sandwiched between the first substrate and the second substrate.

8. The structure of claim 1, further comprising a conductive wiring layer at the backside of the first substrate, wherein the conductive wiring layer is electrically connected to the second conductive contact.

9. The structure of claim 1, wherein the semiconductor structure comprises a plurality of 3D memory structures.

10. The structure claim 9, wherein thickness of the plurality of 3D memory structures is between about 1 µm and 50 µm.

* * * * *